US006978057B1

(12) United States Patent
O'Gorman et al.

(10) Patent No.: US 6,978,057 B1
(45) Date of Patent: Dec. 20, 2005

(54) OPTICAL WAVEGUIDE AND A METHOD FOR PROVIDING AN OPTICAL WAVEGUIDE

(75) Inventors: James Christopher O'Gorman, Dublin (IE); Paul McEvoy, Royston (GB); David McDonald, Dublin (IE); Frederick Paul Logue, Julianstown (IE); Pascal Michel Landais, Dublin (IE)

(73) Assignee: The Provost Fellows and Scholars of the College of the Holy and Undivided Trinity of Queen Elizabeth near Dublin, Dublin (IR)

( * ) Notice: Subject to any disclaimer, the term of this patent is extended or adjusted under 35 U.S.C. 154(b) by 11 days.

(21) Appl. No.: 10/088,758

(22) PCT Filed: Sep. 25, 2000

(86) PCT No.: PCT/IE00/00110

§ 371 (c)(1),
(2), (4) Date: Jul. 18, 2002

(87) PCT Pub. No.: WO01/22543

PCT Pub. Date: Mar. 29, 2001

(30) Foreign Application Priority Data

Sep. 23, 1999 (IE) ................................. XS990793

(51) Int. Cl.[7] .............................................. G02B 6/00

(52) U.S. Cl. ........................................ 385/14; 385/37

(58) Field of Search ......................... 385/14, 129–132, 385/37, 1–11, 16–24; 362/800; 438/29, 31; 257/431, 432; 372/43–50

(56) References Cited

U.S. PATENT DOCUMENTS 4,953,939 A * 9/1990 Epworth ..................... 398/147

(Continued)

FOREIGN PATENT DOCUMENTS

DE  39 140001 A  10/1990

OTHER PUBLICATIONS

D. A. Kozlowski et al; "Singlemode 1.3 M Fabry-Perot Lasers by mode Suppression"; Electronics Letters, GB, IEE Stevenage, vol. 31, No. 8; Apr. 13, 1995.

(Continued)

*Primary Examiner*—Michelle Connelly-Cushwa
(74) *Attorney, Agent, or Firm*—Sughrue Mion, PLLC

(57) ABSTRACT

A laser diode (1) having an optical path (15) defined in an active layer (2) which is sandwiched between a substrate layer (3) and a top layer (4) and defined by a ridge (14) formed in the top layer (4) outputs laser light of a single predetermined wavelength. Refractive index altering grooves (21) extending transversely in the top layer (4) are provided at spaced apart locations for altering the refractive index of the active layer (2) along the optical path at partial reflecting locations (20) for causing partial longitudinal reflections of the laser light generated in the optical path (15) so that standing waves or harmonics thereof of the single predetermined wavelength are set up between the respective partial reflecting locations (20) and a first mirror facet (8) in the optical path (15). In order that the standing waves set up between the partial reflecting locations (20) and the first mirror facet (8) are harmonics of the predetermined single wavelength, the refractive index altering grooves (21) are located along the ridge (14) for forming the reflecting locations (20) at distances from the first mirror facet (8) which correspond to the effective length of the optical path (15) resulting from the affect of the inclusion of the reflecting locations (20) rather than at locations corresponding to the actual length of the light path (15).

28 Claims, 7 Drawing Sheets

U.S. PATENT DOCUMENTS

Figure 1:
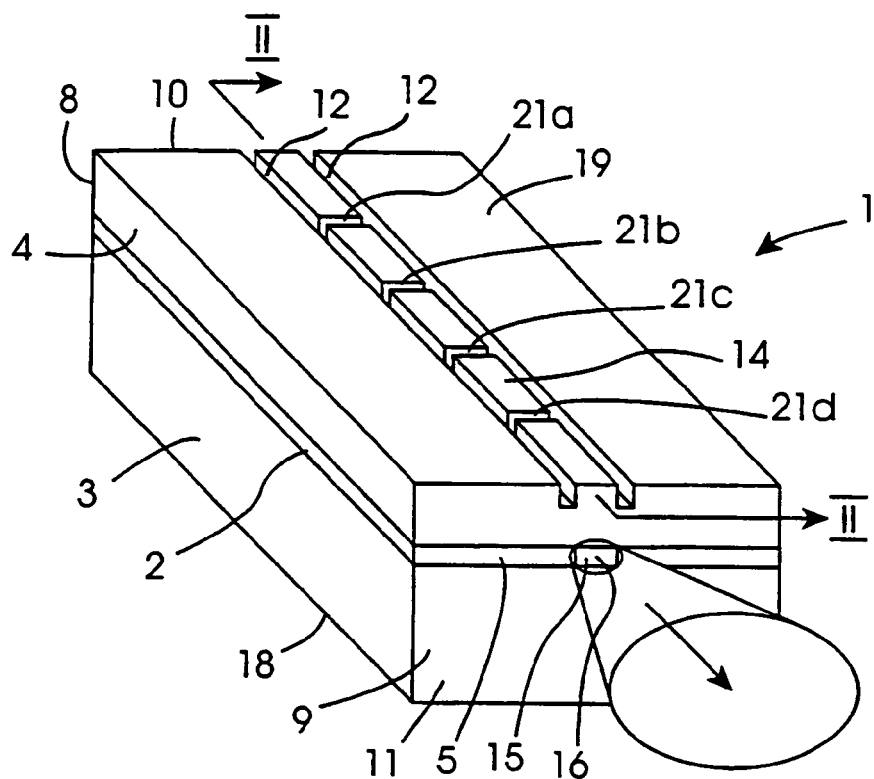

| | | | | |
|---|---|---|---|---|
| 4,976,539 A | * | 12/1990 | Carlson et al. | 356/5.05 |
| 5,177,758 A | * | 1/1993 | Oka et al. | 372/50 |
| 5,358,896 A | * | 10/1994 | Komatsu et al. | 438/31 |
| 5,712,715 A | * | 1/1998 | Erdogan et al. | 359/8 |
| 5,717,799 A | * | 2/1998 | Robinson | 385/37 |
| 6,104,852 A | * | 8/2000 | Kashyap | 385/123 |
| 6,490,044 B1 | * | 12/2002 | Koch et al. | 356/478 |
| 6,636,678 B1 | * | 10/2003 | Bendett et al. | 385/132 |
| 2001/0031114 A1 | * | 10/2001 | Kashyap | 385/37 |

OTHER PUBLICATIONS

D. McDonald et al; "Performance Characteristics of Quasi-Single Longitudinal-mode Fabry-Perot Lasers", IEEE Photonics Technology Letters; US; IEEE Inc. NY; vol. 8, No. 9; Sep. 1, 1996.

L. F. Dechiaro; "Spectral Width Reduction in Mutilongitudinal mode Lasers by Spatial Loss Profiling", Journal of Lightwave Technology; vol. 9, No. 8; Aug. 1991.

Patent Abstract of Japan; vol. 013, No. 144; Apr. 10, 1989.

* cited by examiner

OPTICAL WAVEGUIDE AND A METHOD FOR PROVIDING AN OPTICAL WAVEGUIDE

The present invention relates to an optical waveguide, and to a method for providing the optical waveguide.

Waveguides may be provided as optical filters, for example, for filtering light to provide light of a substantially single predetermined wavelength. Waveguides may also be provided as semiconductor laser light generating devices. Where waveguides are provided as filters, such filters may comprise an optical fibre core which defines an optical path for guiding laser light through the filter, and may also be semiconductor waveguides. The optical fibre core is surrounded by a cladding medium of refractive index different to that of the optical fibre core for confining the light substantially within the optical fibre core. Semiconductor laser light generating devices, for example, laser diodes comprise a light conducting medium which defines an optical path which is effectively a waveguide for guiding the laser light which is generated in the light conducting medium along the optical path.

Optical waveguides incorporating wavelength selective characteristics are particularly useful in optical technology. For example, optical fibre devices are useful for many applications in modern optical communications and sensing, in wavelength division multiplexing (WDM) and in other fibre optic applications. Fibre Bragg grating (FBG) devices, fibre lasers, distributed Bragg reflector (DBR) devices and distributed feedback (DFB) devices have been used as wavelength selective devices and sources for these applications. Wavelength selection is an important attribute in optical filters and light emitters. For example, Fibre Bragg gratings for wavelength selection and distributed feedback gratings for single wavelength or single mode operation of semiconductor lasers are essential elements of WDM communications technology. In the optical fibre waveguide field efforts have been made to devise new grating structures for new component functionality, for example, long period fibre Bragg gratings, and to improve performance of existing components.

In the semiconductor laser field, Fabry Perot (FP) cavity lasers have many advantages over other laser types in terms of cost and east of processing but have poor single wavelength or single mode performance. Consequently, efforts have been made to devise an FP laser which has sufficient single mode character to be used in the abovementioned applications. One approach to obtaining single longitudinal mode FP lasers is described by Coldren et al (L. A. Coldren, B. I. Miller, K. Iga and J. A. Rentschler in *Applied Physics Letters* (1981), 38(5), P. 315–317; K. J. Ebeling, L. A. Coldren, B. I. Miller and J. A. Rentschler in *Applied Physics Letters* (1983), 42(1), P. 6–8). Coldren et al divided a GaInAsP laser into two coupled sections by forming a shallow groove in the semiconductor material by reactive ion etching. For a configuration where two sections (of lengths $l^1$ and $l_2$) are separated by a groove of about 1 $\mu$m width and $l_2/l_1=\frac{1}{8}$, it is found that every eight mode in the emission spectrum is enhanced while the intervening modes are suppressed. This discrimination between modes, leads to essentially single mode or wavelength operation. The possibility of "multi-element or multi-cavity section lasers is also disclosed.

DeChiaro (L. F. DeChiaro: *Journal of Lightwave Technoloy* (1990), 8(11), 1659–1669; and *Journal of Lightwave Technology* (1991), 9(8), 975–986) discloses that operation approaching single longitudinal mode operation, with side mode suppression of 20 dB can be obtained by the introduction of absorbing regions at appropriate locations along the active layer of a ridge waveguide device. The absorbing defects are created in the active layer using a pulsed xenon laser focused on the active stripe of the waveguide. It is suggested that reduced spectral width operation approaching single-mode operation can be achieved by placing N absorbing sites along the active region with the $n^{th}$ site located at the distance $L/2^n$ from one of the laser facets (where L is the length of the cavity).

Kozlowski and Young et al, (D. A. Kozlowski; J. S. Young; J. M. C. England and R. G. S. Plumb: *Electronics Letters* (1995), 31(8), 648–650 and *IEE Proceedings; Part J. Optoelectronics* (1996), 143(1), 71–76; J. S. Young; D. A. Kozlowski; J. M. C. England and R. G. S. Plumb: *Electronics Letters* (1995), 31(4), 290–291) have disclosed that pits etched by a focused $Ga^+$ ion beam along the lasing region of an FP device to stimulate reflective and nonradiative defects results in quasi-single mode operation with 30 dB side mode suppression with a negligible rise in the threshold current. With defect sites introduced at fractional positions (½, ¼ and ⅛ the cavity length) scattering caused by the defects modifies the gain profile enhancing some modes and suppressing others. It is acknowledged that the position and depth of the pits, dependent on the reliability of the focussed ion beam etching process used to form the pits, are crucial to the operation of the device.

Corbett and McDonald (B. Corbett and D. McDonald: *Electronics Letters* (1995), 31(25), 2181–2182; D. McDonald and B. Corbett: *IEEE Photonics Technology Letters* (1996), 8(9), 1127–1129) disclose a technique for converting the multi-longitudinal mode output of 1.3 $\mu$m ridge waveguide FP laser into a single mode by introducing refractive index perturbations along the length of the ridge. These perturbations are in the form of slots etched into the guide ridge, with a controlled depth and location relative to the total physical length of the device, forming a number of regions with altered refractive indices in the laser cavity. The slots do not reach the active region of the laser, but cause refractive index perturbations at photolithographically defined positions along the length of the cavity causing some optical modes to undergo reflection. Optical frequencies that are resonant with any of the sub-section lengths are enhanced. A multi-mode laser having slots located at positions of ½, ¼ and ⅛ of the total physical cavity length is found to exhibit quasi single mode behaviour with a side mode suppression ratio (SMSR) of up to 25 dB. The modes that satisfy the lasing condition for the modified cavity are reinforced and so have a lower threshold gain and reach threshold first.

However, in general the above discussed devices tend to suffer from disadvantages. In general, they tend to be relatively inefficient, and do not adequate provide a laser light output of a substantially single predetermined wavelength. Additionally, the above discussed waveguides relatively easily lose their single mode performance as the operating temperature changes, and furthermore, single mode performance may be lost as a result of changes in drive current.

There is therefore a need for an optical waveguide and a method for providing the optical waveguide which provides a laser light output of a substantially single predetermined wavelength.

The present invention is directed towards providing such an optical waveguide and a method for providing an optical waveguide.

According to the invention there is provided an optical waveguide for outputting light of a substantially single predetermined wavelength, the optical waveguide comprising a light conducting medium defining a longitudinally extending optical path for guiding the light, the optical path extending longitudinally between respective spaced apart first and second ends, and a means for causing partial longitudinal reflections of the light along the optical path at at least two spaced apart partial reflecting locations along the optical path for deriving light of the predetermined wavelength, wherein the means for causing the partial reflections locates the reflecting locations along the optical path at distances from the first end along the optical path which are functions of the effective optical length of the optical path taking account of alteration to the actual length of the optical path resulting from the affect of the means for causing the partial reflections on the actual length of the optical path.

In one embodiment of the invention the means for causing the partial reflections of the light at the at least two reflecting locations comprises a refractive index altering means for altering the effective refractive index of the light conducting medium presented to light passing along the optical path at each of the at least two reflecting locations for causing the partial reflections.

In another embodiment of the invention the length of each reflecting location in the longitudinal direction of the optical path is relatively short.

In a further embodiment of the invention the length of each reflecting location in the longitudinal direction of the optical path is in the range of 0.3 microns to 200 microns.

Preferably, the length of each reflecting location in the longitudinal direction of the optical path is in th range of 1 micron to 4 microns.

The respective lengths of the reflecting locations along the optical path may be the same or different. The effective refractive indices of the respective reflecting locations may be the same or different.

In one embodiment of the invention the distance of each reflecting location from the first end along the optical path is a function of the product of the actual length of the optical path and the actual refractive index of the light conducting medium defining the optical path, less the sum of the products of the lengths of the reflecting locations and the differences between respective effective refractive indices of the reflecting locations and the actual refractive index of the light conducting medium defining the optical path.

In another embodiment of the invention the distance of each reflecting location from the first end along the optical path is a function of the sum of the products of the lengths of the reflecting locations intervening between the first end and that reflecting location and the differences between respective effective refractive indices of the reflecting locations and the actual refractive index of the light conducting medium defining the optical path.

In a further embodiment of the invention the distance of each reflecting location from the first end along the optical path is a function of the product of half the length of that reflecting location and the difference between its effective refractive index and the actual refractive index of the light conducting medium defining the optical path.

In a still further embodiment of the invention the distance of each reflecting location from the first end along the optical path is a function of the actual refractive index of the light conducting medium defining the light path.

In one embodiment of the invention the distance of the $p^{th}$ reflecting location from the first end along the optical path is provided by the formula:

$$L = \frac{X\left\{L_{device}n_{device} - \sum_{i} l_i \Delta n_i\right\} + \sum_{i=1}^{p-1} l_i \Delta n_i + \frac{1}{2}l_p \Delta n_p}{n_{device}}$$

where:
L is the distance of the $p^{th}$ reflecting location from the first end along the optical path,
X is the fraction of the actual optical length at which the element is to be placed,
$L_{device}$ is the actual length of the optical path,
$n_{device}$ is the average refractive index of the light conducting layers of the unperturbed light conducting medium of the optical path presented to the light,
$l_i$ is the length of the $i^{th}$ reflecting location in the direction of the optical path,
$\Delta n_i$ is the difference between the effective refractive index of the $i^{th}$ partial reflecting location and the average refractive index of the unperturbed optical path,
$l_p$ is the length of the $p^{th}$ reflecting location in the direction of the optical path, and
$\Delta n_p$ is the difference between the effective refractive index of the $p^{th}$ partial reflecting location and the average refractive index of the optical path.

Preferably, the refractive index altering means comprises a plurality of refractive index altering elements one refractive index altering element being provided for each reflecting location, the respective refractive index altering elements being located distances from the first end along the optical path similar to the distances from the first end of the corresponding reflecting location.

Advantageously, each refractive index altering element is located spaced apart from an active region within which the optical path is defined.

In one embodiment of the invention each refractive index altering element is provided by a refractive index altering groove formed in a medium adjacent the light conducting medium but spaced apart therefrom.

The depth of the refractive index altering grooves may be the same or different.

In one embodiment of the invention each refractive index altering element extends substantially transversely relative to the optical path.

Alternatively, the respective reflecting locations are formed by a dopant.

In another embodiment of the invention the distance from the first end along the optical path to each reflecting location is measured to the centre of the reflecting location.

In a further embodiment of the invention the optical waveguide is a waveguide for laser light.

In another embodiment of the invention the waveguide is a semiconductor laser light generating device.

In another embodiment of the invention, the optical waveguide is a passive semiconductor waveguide.

In a further embodiment of the invention, a ridge is formed on a surface of the semiconductor laser waveguide for defining the optical path through the light conducting medium.

In a still further embodiment of the invention the refractive index altering elements are located in the ridge at locations corresponding to the reflecting location.

In one embodiment of the invention the refractive index altering elements are located in the ridge at locations directly corresponding to the partial reflecting location.

In another embodiment of the invention, the optical waveguide is a buried hetrostructure laser.

Alternatively, the optical waveguide comprises a fibre optic waveguide.

In another embodiment of the invention the waveguide is a filter comprising an optical fibre core which forms the light conducting medium for defining the optical path, the optical fibre core being surrounded by cladding medium of refractive index different to that of the optical fibre core.

In a still further embodiment of the invention each refractive index altering element is located in and extends around the cladding medium.

In a further embodiment of the invention the means for causing the partial reflections causes the partial reflections at at least three reflecting locations along the optical path.

In one embodiment of the invention, the reflecting locations are provided at respective distances from the first end which correspond to the following fractions of the actual length of the optical path, namely, $1/14$, $1/7$, $3/14$, $2/7$, $3/7$, $4/7$ and $5/7$ along the optical path. Preferably, the respective distances along the optical path from the first end at which the reflecting locations are located which correspond to the fractions of the actual length of the optical path of $1/14$, $1/7$, $3/14$, $2/7$, $3/7$, $4/7$ and $5/7$ are 39.3, 78.6, 118.0, 157.3, 235.9, 314.5 and 393.1 microns for a waveguide of actual length of 550 microns.

In another embodiment of the invention, reflecting locations are provided at respective distances from the first end which correspond to the following fractions of the actual length of the optical path, namely, $1/16$, $1/8$, $3/16$, $1/4$, $5/16$, $3/8$, $1/2$, $5/8$ and $3/4$ along the optical path. Preferably, the respective distances along the optical path from the first end at which the reflecting locations are located which correspond to the fractions of the actual length of the optical path of $1/16$, $1/8$, $3/16$, $1/4$, $5/16$, $3/8$, $1/2$, $5/8$ and $3/4$ are 18.74, 37.55, 56.36, 75.16, 93.97, 112.78, 150.26, 187.74 and 225.23 microns for a waveguide of actual length of 300 microns.

In another embodiment of th invention the optical waveguide comprises a plurality of optical waveguides provided in the form of an array.

The wavelength of the light outputted from the respective waveguides of the array may be the same or different.

Further, the invention provides an array of optical waveguides, the respective optical waveguides being optical waveguides according to the invention.

Additionally, the invention provides a method for providing an optical waveguide for outputting light of a substantially single predetermined wavelength, the method comprising providing a light conducting medium defining a longitudinally extending optical path for guiding the light, the optical path extending longitudinally between respective spaced apart first and second ends, and providing a means for causing partial longitudinal reflections of the light along the optical path at at least two spaced apart partial reflecting locations along the optical path for deriving the light of the predetermined wavelength, wherein the means for causing the partial reflections are provided such that the reflecting locations are at distances from the first end along the optical path which are functions of the effective optical length of the optical path taking account of alteration to the actual length of the optical path resulting from the affect of the means for causing the partial reflections on the actual length of the optical path.

The advantages of the invention are many. By virtue of the fact that the partial reflecting locations are located at distances from the first end of the optical path which are based on the effective optical length of the optical path, rather than the actual length of the optical path, the partial reflecting locations are provided at substantially the precise location which facilitates the setting up of corresponding standing waves or harmonics thereof of desired wavelength between the respective partial reflecting location and the first end of the optical waveguide. In this way the optical waveguides according to the invention output light of a substantially single predetermined wavelength. This, thus provides optical waveguides with significant advantages over prior art optical waveguides where the partial reflecting locations are provided at distances from one end of the optical waveguide which correspond to the actual length of the optical path. Since the effective length of the optical path varies depending on the number of partial reflecting locations provided in the optical path, and the effective refractive index of the partial reflecting locations, the partial reflecting locations in prior art devices are not positioned at optimum locations for setting up of standing waves of the desired wavelength or harmonics thereof.

A further advantage of the invention is that it permits of the emission characteristics of the optical waveguide to be determined after the epitaxial layer growth phase of fabrication of a laser diode has been completed.

A further and particularly important advantage of the invention is that it provides a robust optical waveguide which is substantially temperature stable, and when the waveguide is provided as a laser diode the single mode nature of the laser diode light emission is also temperature stable over a relatively large range of temperatures, and in particular, is current stable over a reasonably wide range of operating currents, and thus produces a laser light output of a predetermined wavelength which is stable over a reasonable range of temperatures and operating currents.

Figure 2:
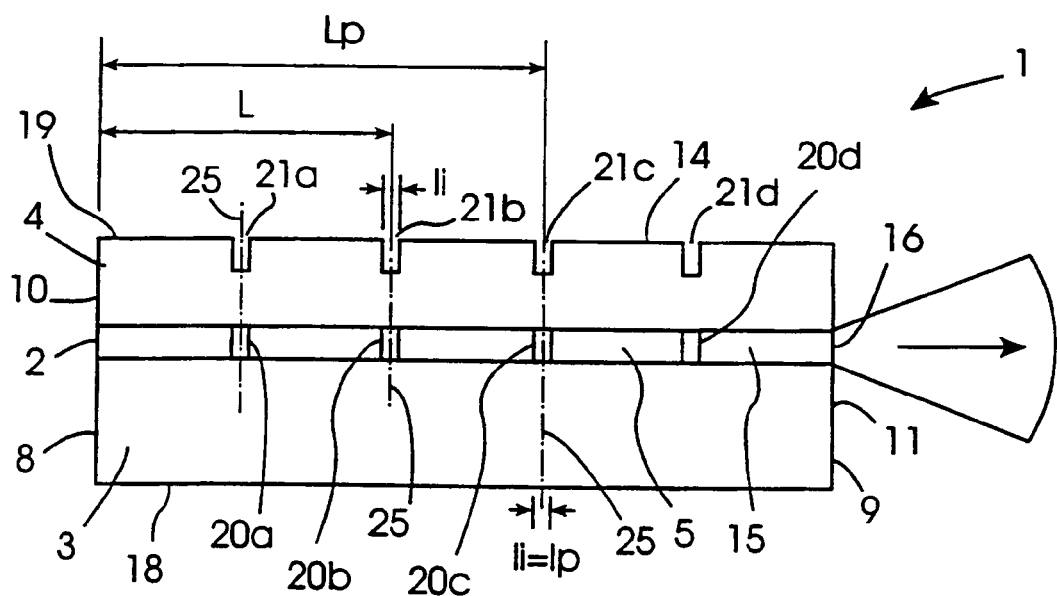
Figure 3:
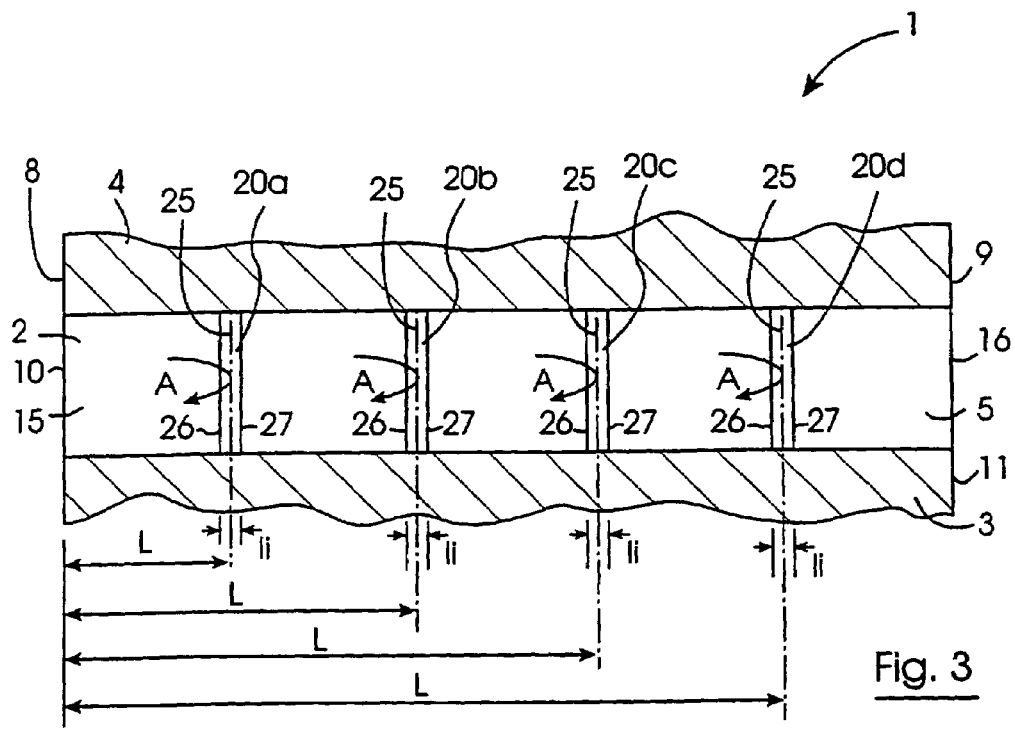
Figure 4:
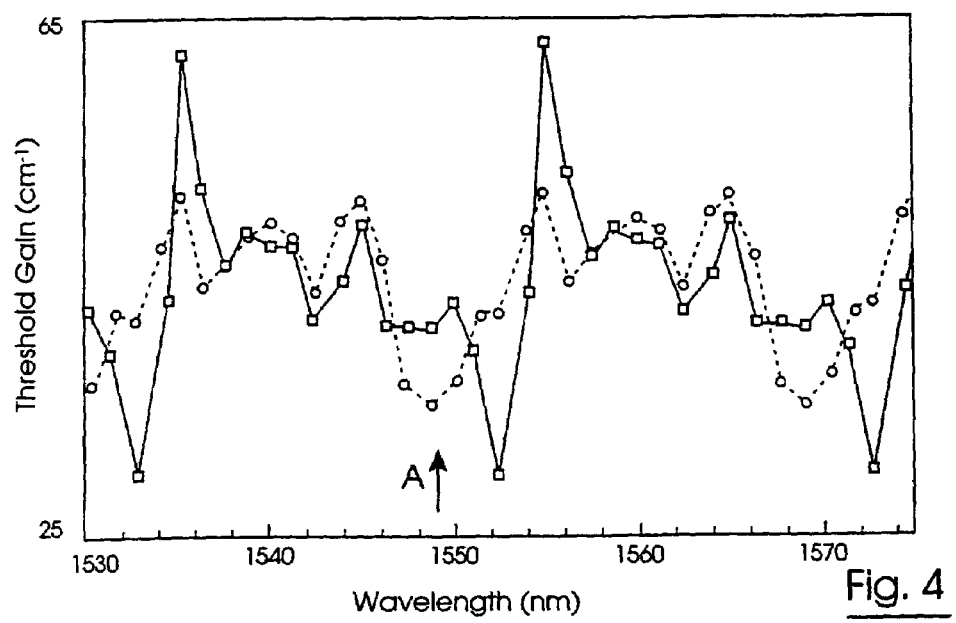
Figure 5:
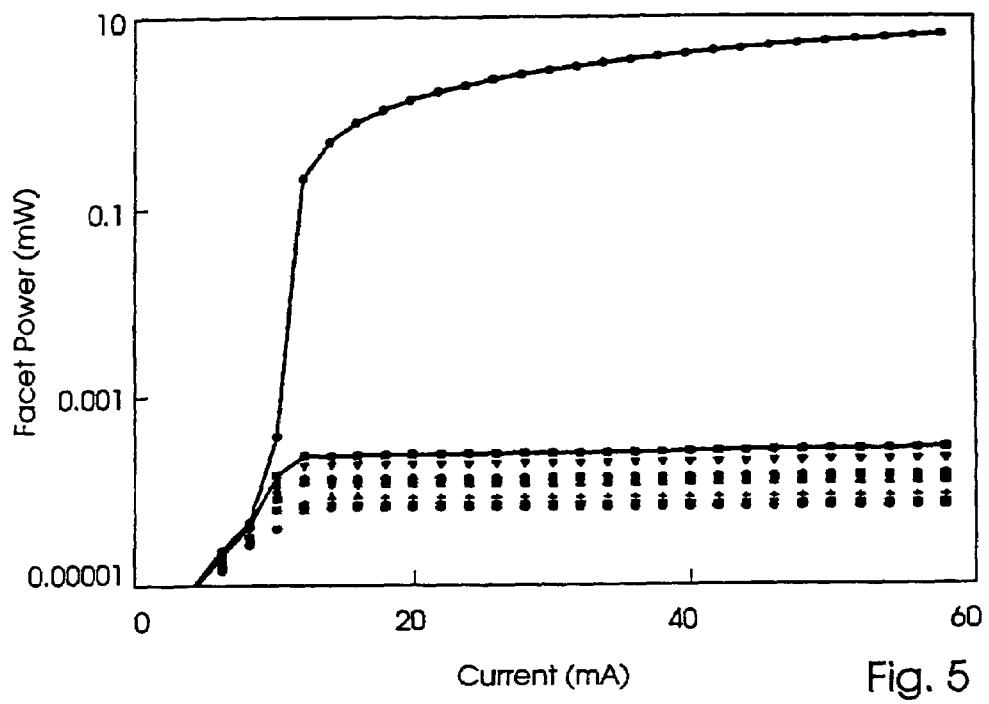
Figure 6:
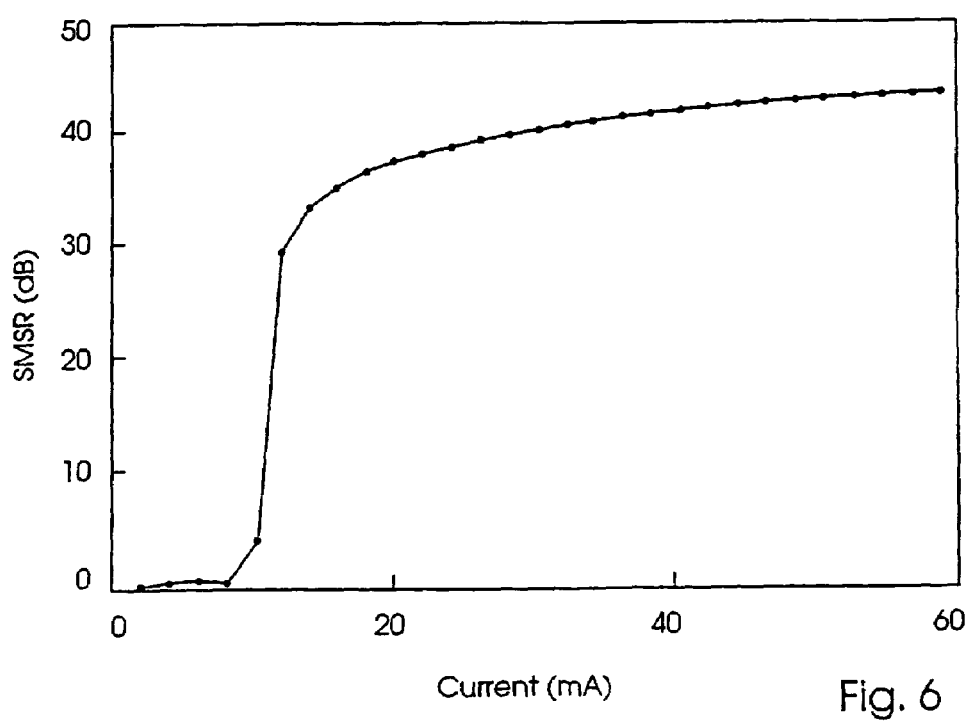
Figure 7:
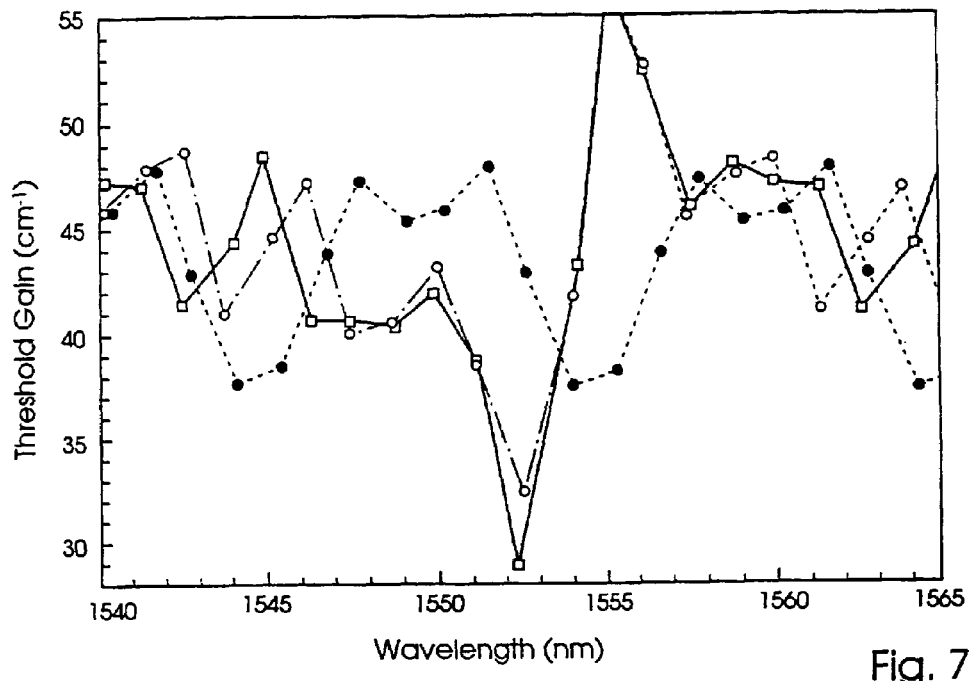
Figure 8:
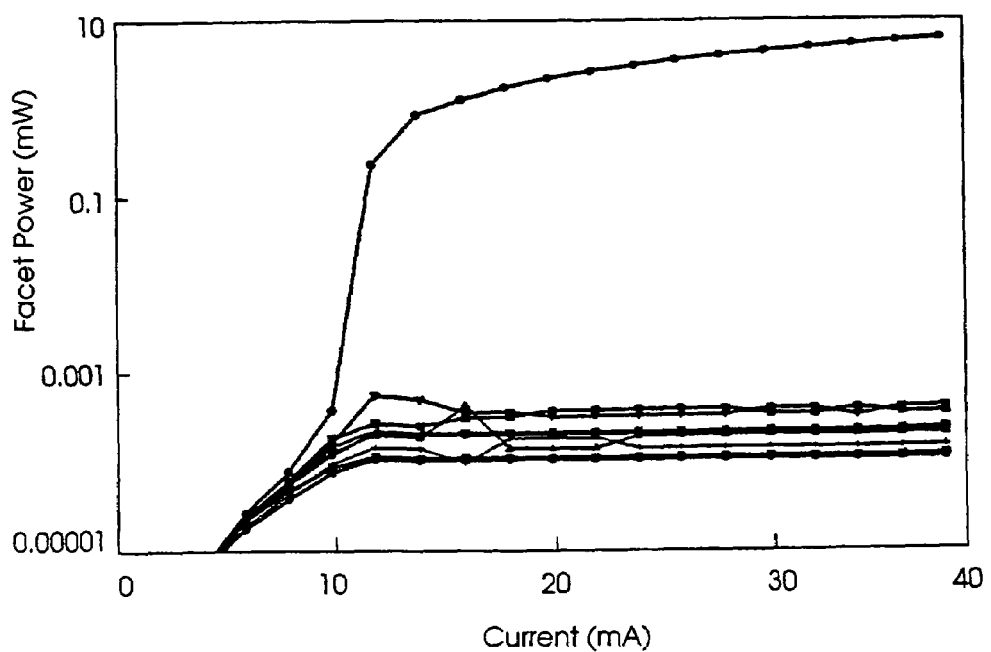
Figure 9:
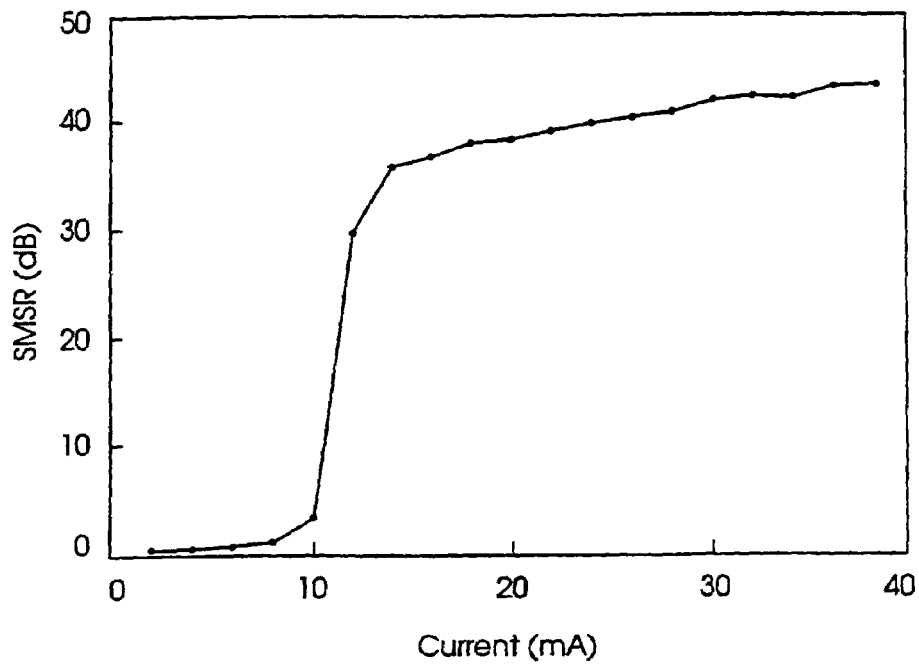
Figure 11:
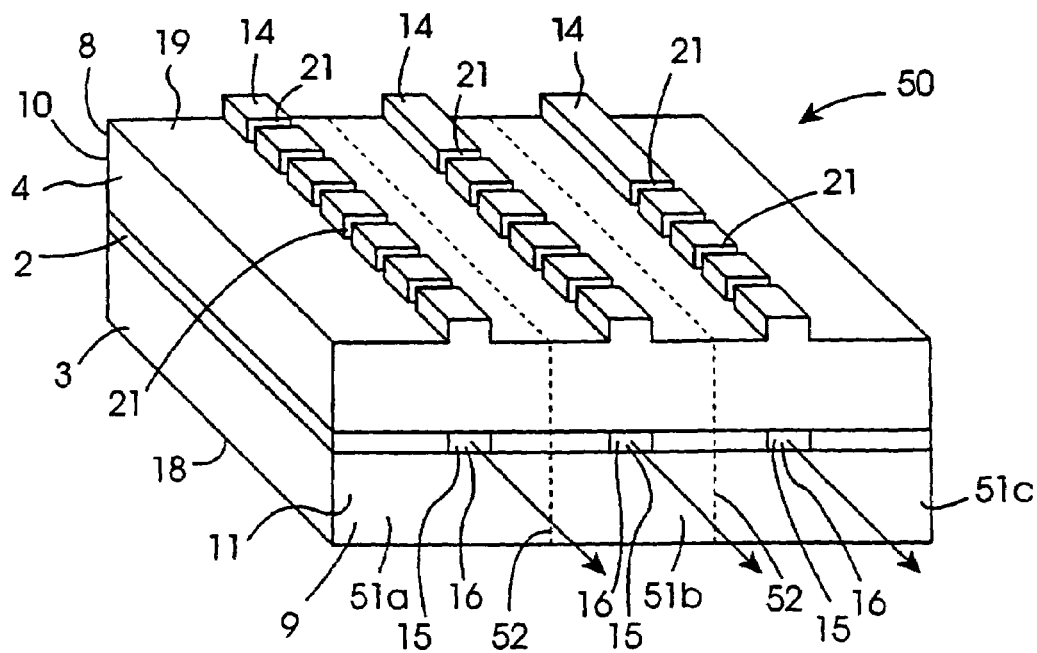
Figure 12:
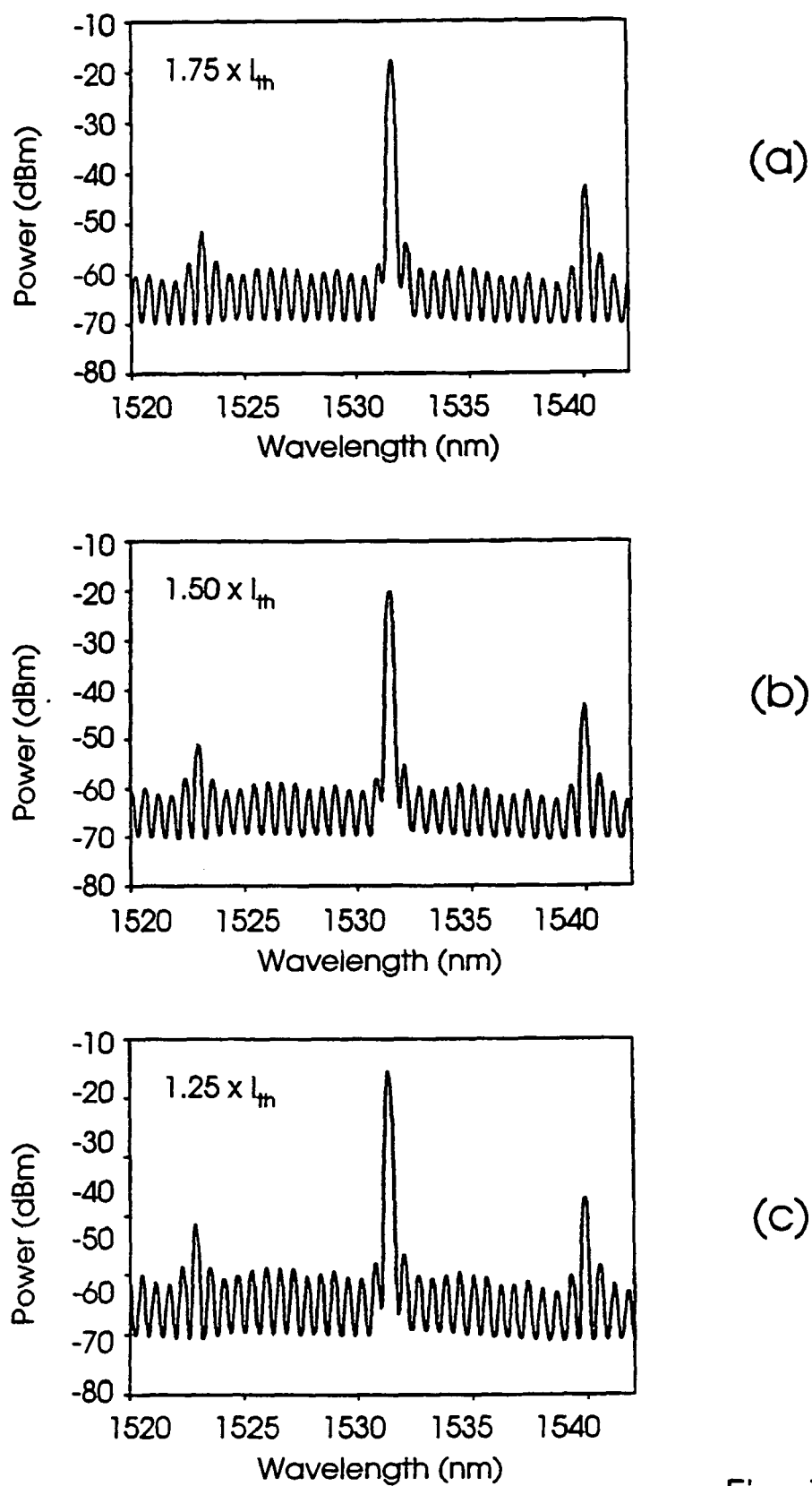

The invention will be more clearly understood from the following description of some preferred embodiments thereof which are given by way of example only with reference to the accompany drawings, in which:

FIG. 1 is a perspective view of a ridge type waveguide laser diode according to the invention, FIG. 2 is a transverse cross-sectional side elevational view of the laser diode on the line II—II of FIG. 1, FIG. 3 is an enlarged transverse cross-sectional view similar to FIG. 2 of a portion of the laser diode of FIG. 1 in another embodiment of the invention, FIG. 4 is a graphical representation based on mathematical models of the threshold gain plotted against wavelengths for two laser diodes, one based on the prior art, and one based on the invention, FIG. 5 is a graphical representation based on a mathematical model of a plot of facet output power against operating current for the dominant lasing mode and a number of subsidiary lasing modes of a laser diode based on the invention, FIG. 6 is a graphical representation based on a mathematical model of a plot of side mode suppression ratio against operating current for a laser diode based on the invention, FIG. 7 is a graphical representation based on a mathematical model of a plot of threshold gain against wavelengths for three laser diodes prepared based on the invention, FIG. 8 is a graphical representation based on a mathematical model of a plot of facet power against operating current for laser diodes prepared based on the invention, FIG. 9 is a graphical representation based on a mathematical model of a plot of side mode suppression ratio against operating current for a laser diode based on the invention, FIGS. 10(a) and (b) are perspective views of respective laser diodes also according to the invention, FIG. 11 is a perspective view of an array of laser diodes also according to the invention, and FIGS. 12(a) to (c) are plots of power output against wavelength of identical laser diodes prepared according to the invention which are subjected to different operating currents.

Referring to the drawings and initially to FIGS. 1 to 3 there is provided a ridge type laser device which is indicated generally by the reference numeral 1 for outputting laser light of a substantially single wavelength. The laser diode 1 is formed by a layered structure comprising an active layer 2 which is sandwiched between a lower substrate layer 3 and a top layer 4. The active layer 2 forms a light conducting medium 5 within which the laser light is generated. Although the laser diode 1 has been illustrated, and briefly described as comprising three layers only, namely, the substrate layer 3, the active layer 2 and the top layer 4, it will be readily apparent to those skilled in the art that the laser diode 1 will have many more layers, particularly, in the region of the active layer, however, for convenience and ease of illustration and description the laser diode is being described as comprising the three layers 2, 3 and 4 only. The layered structure of the laser diode 1 is cleaved from a semiconductor wafer, and during cleaving first and second ends 8 and 9, respectively, are formed with first and second mirror facets 10 and 11, respectively. The first and second mirror facets 10 and 11 may or may not be coated for internal reflection of laser light generated within the active region 2. A pair of parallel elongated channels 12 formed in the top layer 4 extend longitudinally between the respective first and second ends 8 and 9 for forming an elongated ridge 14 extending between the first and second ends 8 and 9. The ridge 14 defines in the active layer 2 an elongated optical path 15 which extends between the first and second ends 8 and 9, and along which laser light is generated and guided through small emitting areas 16 in the first and second mirror facets 10 and 11 in the first and second ends 8 and 9 of the laser diode 1. Electrical contacts (not shown) are provided on an under surface 18 of the substrate layer 3 and on a top surface 19 of the ridge 11 for applying a voltage across the laser diode 1 for driving a current through the laser diode 1, for in turn generating the laser light along the optical path 15.

A means for causing partial longitudinal reflection of the light within the optical path 15 at four spaced apart partial reflecting locations 20 along the optical path 15 comprises in this embodiment of the invention four refractive index altering elements, namely, four refractive index altering grooves 21 for altering the effective refractive index of the light conducting medium in the optical path 15 at the respective reflecting locations 20. By altering the effective refractive index of the light conducting medium in the optical path 15 present d to the laser light being guided through the optical path 15 partial longitudinal reflection of the guided laser light is caused at each of the reflecting locations 20. The refractive index altering grooves 21 are formed in the ridge 14. The refractive index altering grooves are located at distances L from the first end 8 which are similar to the distances L from the first end at which the reflecting locations 20 are to be located.

The feature of providing partial reflecting locations along an optical path of a laser diode for outputting laser light of a substantially single predetermined wavelength is known. However, in prior art devices the partial reflecting locations are located along the optical path at distances which correspond directly to a fraction of the actual length of the optical path, in other words, the actual length of the laser diode between the respective first and second ends 8 and 9, for reflecting light of the desired wavelength or a harmonic thereof. Such fractions, typically, are ½, ¼, ⅛, 1/16, etc of the actual length of optical path. However, it has been found that the introduction of the reflecting locations alters the effective optical length of the optical path, and by locating the reflecting locations at fractional distances of the actual length of the optical path the positions of the reflecting locations no longer correspond to the desired wavelength or a harmonic thereof. Accordingly, the laser diode 1 according to the present invention overcomes this problem by providing the refracting index altering grooves 21 at respective distances L from the first end 8 of the laser diode 1 for forming the reflecting locations at corresponding distances L from the first end 8 which are based on fractional lengths of the effective optical length of the optical path 15 resulting from the affects that the reflecting locations 20 have on the actual length of the optical path.

Referring in particular to FIG. 3 the effective optical length of the optical path 15 $L_{eff}$ resulting from the affect of the reflecting locations 20 is given by the following equation:

$$L_{eff} = L_{device} n_{device} - \sum_i l_i \Delta n_i \qquad \text{Eq. 1}$$

where:

$L_{device}$ is the actual length of the optical path 15, namely, the length of the laser diode 1 between the respective first and second ends 8 and 9 and is chosen depending on the wavelength of the desired single mode wavelength;

$n_{device}$ is the average refractive index of the light conducting layers of the unperturbed light conducting medium of the optical path 15;

$l_i$ is the length of the $i^{th}$ refractive index altering groove 21 in the longitudinal direction of the optical path 15;

$\Delta n_i$ is the difference between the effective refractive index of the reflecting location 20 caused by the $i^{th}$ groove 21 and the average refractive index of the unperturbed light conducting medium of the optical path 15.

The term average refractive index" in relation to the light conducting medium means the average refractive index of the light conducting layers of the light conducting medium which are presented to light passing through the light conducting medium. The term "unperturbed" when used to qualify the light conducting medium in relation to the average refractive index means the average refractive index of the light conducting layers of the light conducting medium which would be presented to light passing through the light conducting medium if the reflecting locations 20 were omitted.

Accordingly, based on equation Eq. 1 the optical length $L_g$ from the first end 8 along the ridge 14 at which the $p^{th}$ groove 21 should be placed based on the effective optical length of the optical path 15 is given by the equation:

$$L_g = L_g n_{device} - \sum_{i=1}^{p-1} l_i \Delta n_i - \frac{1}{2} l_p \Delta n_p \qquad \text{Eq. 2}$$

where:
$l_p$ is the length of the $p^{th}$ refractive index altering groove 21 in the longitudinal direction of the optical path 15,
$\Delta n_p$ is the difference between the effective refractive index of the reflecting location 20 caused by the $p^{th}$ groove 21 and the average refractive index of the unperturbed light conducting medium of the optical path 15; and
the other terms are as defined with reference to equation Eq. 1.

Accordingly, from Eq. 1 and Eq. 2 the actual distance L from the first end 8 along the ridge 14 at which the $p^{th}$ refractive index altering groove 21 should be located is given by the following equation:

$$L = \frac{X\left\{L_{device}n_{device} - \sum_i l_i \Delta n_i\right\} + \sum_{i=1}^{p-1} l_i \Delta n_i + \frac{1}{2}l_p \Delta n_p}{n_{device}} \qquad \text{Eq. 3}$$

where:
X is the fraction of the length of the optical path at which the $p^{th}$ refractive index altering groove 21 is to be placed; and
the other terms are as defined with respect to Eq. 1 and Eq. 2.

In the above Eq. 1 and Eq. 2 the distances L and $L_g$ of the grooves 21 are measured from the first end 8 to a centre line 25 of each groove 21.

In FIG. 3 the partial longitudinal reflections of the laser light being generated and guided along the optical path 15 occur adjacent the centre line 25 at each reflecting location 20 which corresponds with the centre line 25 of the corresponding groove 21. The partial longitudinal reflections of the laser light are illustrated by the arrows A. In this embodiment of the invention the length $l_i$ of the refractive index altering grooves 21 are identical to each other, and it is assumed that the length in the longitudinal direction of the optical path 15 of the reflecting locations 20 is similar to the length $l_i$ of the refractive index altering grooves 21, and thus similar to each other. Additionally, the refractive index altering grooves 21 and in turn the reflecting locations 20 are located at equal intervals along the length of the optical path 15. However, it will be appreciated that in practice the length I of the refractive index altering grooves 21, and in turn the reflecting locations 20 may differ from each other and furthermore, the spacing between adjacent refractive index altering grooves and corresponding reflecting locations 20 may also vary.

In order to more fully understand the invention the partial reflections of the laser light at the respective reflecting locations 20 will be described with reference to FIG. 3. For ease of explanation the groove 21 nearest the first end 8 is identified as the groove 21*a* and its corresponding reflecting location is identified as 20*a*. The next groove is 21*b* and its corresponding reflecting location is 20*b*, and so on to groove 21*d* and reflecting location 20*d*. Laser light propagating along the optical path 15 in the direction from the first mirror facet 10 to the second mirror facet 11 initially encounters the first reflecting location 20*a* and a partial reflection of the propagating light is reflected at the first partial reflecting location 20*a* towards the first mirror facet 10 as a result of the altered refractive index in the reflecting location 20*a*. Accordingly, a standing wave is set up between the first mirror facet 10 and the first of the partial reflecting locations 20*a*. The remainder of the propagating laser light continues through the first partial reflecting location 20*a* to the second partial reflecting location 20*b* at which a second partial reflection occurs. Due to the fact that the second partial reflecting location 20*b* has been located based on the effective length of the optical path 15, rather than the actual length of the optical path 15, the effective optical path travelled by the light from the first mirror facet 10 to the second partial reflecting location 20*b* is exactly twice that travelled by the first reflection which occurred at the first partial reflecting location 20*a*. Accordingly, a standing wave is set up between the second partial reflecting location 20*b* and the first mirror facet 10 which is a harmonic of the standing wave set up between the first reflecting location 20*a* and the first mirror facet 10. Third and fourth partial reflections occur at the respective third and fourth reflecting locations 20*c* and 20*d* which set up standing waves between themselves and the first mirror facet 10. Since the effective optical path travelled by the light from the first mirror facet 10 to the respective third and fourth reflecting locations 20*c* and 20*d* is respectively three and four times that travelled by the light from the first mirror facet 10 to the first reflecting location 20*a*, the standing waves set up between the first mirror facet 10 and the third and fourth reflecting locations 20*c* and 20*d* are each in harmonic relationship with each other, and also in harmonic relation with the first and second standing waves.

Although the partial reflections caused by the respective reflecting locations 20 have been described as taking place exactly at the centre lines 25 of the respective reflecting locations 20, it will be apparent to those skilled in the art that the actual partial reflections occur at the boundary layers where the refractive index of the optical path 15 changes from one value of refractive index to another. In other words, partial reflections will actually occur at the boundary layers 26 and 27 of the reflecting locations 20. However, in practice the standing waves set up between the first end 8 and the respective reflecting locations 20 or the harmonics thereof will be pulled towards a wavelength corresponding to the effective optical length of the optical path between respective first ends 8 and the centre lines 25 of the respective reflecting locations 20.

In order for a laser diode according to the invention with m reflecting locations 20 of equal length $l_i$ and refractive index difference change $\Delta n_i$ to emit a mode with a desired wavelength, λ, the following condition should be met:

$$\lambda = \frac{2}{K}[(L_{device} - ml_i)n_{device} + ml_i n_i] \qquad \text{Eq. 4}$$

where:
K is an integer;
$n_i$ is the effective refractive index of each of the reflecting location; and
the other terms are as already defined with reference to the equations Eq. 1, Eq. 2 and Eq. 3.

For a laser diode of length $L_{device}$, and an average refractive index $n_{device}$, the larger the difference $\Delta n_i$ between effective refractive index of the reflecting locations 20 and the average refractive index of the light conducting medium of the optical path 15 the more pronounced will be the affect of the reflecting locations 20.

The value of the terms $L_{device}$, $n_{device}$, i, $l_i$ and $\Delta n$ may be chosen so as to yield a groove configuration where the desired wavelength corresponds to an emission mode of the laser diode 1. For semiconductor lasers $L_{device}$ varies typically from 0.2 mm to 1 mm, although, for fibre waveguide devices the lengths, namely, $L_{device}$ may be up to several meters; $n_{device}$ depends on the nature of the material from which the active layer is constructed and may be from approximately 1.5 to approximately 5; $\Delta n$ may typically be from 0.1 to 1, and preferably would more than likely lie within the range 0.4 to 0.8; the number of grooves 21 may be typically from 3 to approximately 60 and $l_i$ may typically be from approximately 1 micron to approximately 20 microns, the lower limit being defined by the etching or other methods for forming the groove.

The final affect on the choice of the total number m of grooves 21 and their length $l_i$ will be the spacing between the least suppressed modes. This spacing may vary depending on the groove structure, but for a structure of equally spaced grooves 21, and in turn equally spaced reflecting locations 20, it is given by the equation:

$$\Delta\lambda = \frac{\lambda^2}{2(L_{device}n_{device} - ml_i\Delta n)} \quad \text{Eq. 5}$$

where: all the terms are as defined in equations Eq. 1 to Eq. 4.

For more complex laser diodes according to the invention with grooves 21 of different lengths $l_i$ inducing reflecting locations 20 of differing refractive indices, a similar method may be used for determining $\Delta\lambda$ but the second part of the optical length expression, $ml_i\Delta_n$ is replaced with the summation of the changes in optical length:

$$\sum_i l_i \Delta n_i$$

It is envisaged that the method according to the invention for producing the laser diode 1 may equally be applied and utilised in the manufacture of passive ridge waveguides, fibre gratings and fibre lasers wherein reflecting locations 20 are positioned according to the method already described depending on the desired operational wavelength. The positions of the refractive index altering grooves 21 for forming the partial reflecting locations along such waveguides would be determined as already described and would be based on the effective optical length of the waveguide. In particular, the relationship expressed in equation Eq. 3 would be used to determine the position of the refractive index altering grooves 21 along the waveguide. Such waveguides may if desired be coupled to a separate conventional semiconductor laser or the laser and waveguide may be formed as a single unit using fabrication techniques which will be well known to those skilled in the art. For such fibre waveguides the actual length of the device and in turn the actual length of the optical path may be defined by the distance between the outermost refractive index altering grooves of the sequence, and the positions of intermediate refractive index altering grooves would be determined by reference to one or more of the outermost refractive index altering grooves.

The benefits and advantages of laser diodes according to the invention will be clearly understood from the following description of examples of laser diodes and their resulting laser light outputs.

EXAMPLE 1

In this example mathematical models of two semiconductor ridge waveguide laser diodes were computed based on laser diodes with identical layered structures. One of the laser diodes was based on the prior art with the refractive index altering grooves 21 located based on the actual length of the optical path 15, while the other laser diode was based on the invention with the refractive index altering grooves 21 located based on the effective optical path 15 according to the invention. When computing the mathematical models the respective laser diodes were assumed to be of similar general construction to that of the laser diode described with reference to FIG. 1 in that the laser diodes were provided with a ridge 14 formed by adjacent parallel longitudinally extending channels 12. The actual length of each laser diode was 300 microns, thus giving an optical path 15 of actual length of 300 microns. In each laser diode nine refractive index altering grooves 21 of identical length $l_i$ of 1 micron where assumed to be etched into the ridge 14 at fractional positions of the length of the laser diode from the first mirror facet 10 of 1/16, 1/8, 3/16, 1/4, 5/16, 3/8, 1/2, 5/8 and 3/4. In the laser diode based on the prior art the refractive index altering grooves 21 were assumed to be positioned at these fractional positions based on the actual length of the laser diode, in other words, based on the actual length of the optical path 15. In the other of the laser diode based on the invention the refractive index altering grooves 21 were assumed to be located at the fractional positions based on the effective length of the optical path 15 making allowance for the alteration in the refractive index of the reflecting locations 20 according to the invention. The distances of the respective refractive index altering grooves 21 from the first mirror facet 10 of each of the laser diodes is set out in Table 1. Column 1 of Table 1 indicates the fractional position of the length of the laser diode from the first mirror facet 10 at which the respective refractive index altering grooves 21 are located. Column 2 of Table 1 sets of the actual distances from th first mirror facet 10 along the ridge 11 at which the respective refractive index altering grooves 21 are located in the laser diode based on the prior art based on the actual length of the optical path 15. Column 3 of Table 1 sets out the actual distances along the ridge 11 from the first mirror facet 10 at which the refractive index altering grooves 21 are located in the laser diode based on the invention and based on the effective length of the optical path 15 taking account of the alterations to the refractive index of the optical path at the reflecting locations 20. In all cases the dimensions set out in Columns 2 and 3 of Table 1 are from the first mirror facet 10 to the centre lines 25 of the respective grooves 21 of each laser diode. The average actual or unaltered refractive index of the light conducting medium of the optical path 15 of each of the laser diodes, namely, $n_{device}$ was assumed to be 3.2031. The difference between the actual refractive index $n_{device}$ of the optical path 15 and the refractive index $n_i$ of each partial reflecting location 20, namely, $\Delta n_i$ was assumed to be 0.4.

TABLE 1

Positions of refractive index altering grooves from the first mirror facet.

| Fractional Position | Distance from first mirror facet, non-optically corrected (microns) (Prior Art) | Distance from first mirror facet, optically corrected (microns) (Invention) |
|---|---|---|
| 1/16 | 18.75 | 18.74 |
| 1/8 | 37.50 | 37.55 |
| 3/16 | 56.25 | 56.36 |
| 1/4 | 75.00 | 75.16 |
| 5/16 | 93.75 | 93.97 |
| 3/8 | 112.50 | 112.78 |
| 1/2 | 150.00 | 150.26 |
| 5/8 | 187.50 | 187.74 |
| 3/4 | 225.00 | 225.23 |

FIG. 4 illustrates the threshold gain plotted against wavelength for each of the laser diodes of Example 1. The full line in FIG. 4 represents the plot of the threshold gain against wavelength for the laser diode based on the invention, while the broken line represents the plot of the threshold gain against wavelength for the prior art laser diode. The threshold gain in each represents the gain required to overcome mirror losses in the laser diodes. Lasing wavelengths having a lower threshold gain reach the lasing threshold at lower pump levels, and therefore are emitted preferentially under these pump conditions. This is the basis of side mode suppression leading to substantially single longitudinal mode emission. In FIG. 4 the degree or extent of suppression of side modes about a given mode is indicated by the difference in the threshold gain values for a mode of interest, for example, the mode indicated by the arrow A in FIG. 4, and the nearest modes on either side of this particular mode. Thus, it can be clearly seen from FIG. 4 that the laser diode based on the present invention exhibits superior side mode suppression than the laser diode based on the prior art.

It can also be seen from FIG. 4 that there is a significant difference of about 3 nm to 4 nm in the wavelength positions of the enhanced modes of the laser light emitted from the laser diode based on the invention as opposed to those of the laser diode based on the prior art.

Referring now to FIG. 5 a plot of the light output as represented by facet power against operating current of the laser diode based on the invention with the features set out in Table 1 is illustrated. The curves of FIG. 5 represent different possible longitudinal modes. However, it can be seen quite clearly that one mode in particular gives a considerably higher output than all the other modes. This is representative of the single mode nature of the laser light output of the laser diode based on the invention of Table 1.

Referring to FIG. 6 a plot of side mode suppression ratio against operating current of the laser diode based on the invention of Table 1 is illustrated. This curve shows the side mode suppression ratio between the single mode which lases preferentially and the next nearest mode. At currents above 20 micro mAmps the side mode suppression ratio is calculated to be approximately 40 dB.

EXAMPLE 2

In this example mathematical models of three laser diodes of identical length and of identical length to the laser diodes of Table 1 were computed based on the invention. The basic construction of the three laser diodes was assumed to be similar to that illustrated in FIG. 1 in that each of the laser diodes are ridge type waveguide laser diodes, each having a ridge 14 formed by longitudinally extending parallel adjacent channels 12. The refractive index altering grooves 21 are formed in the ridge 14 in the same manner as described with reference to the laser diode 1. Table 2 sets out the distances at which the refractive index altering grooves 21 are assumed to be located along the ridge 14 from the first mirror facet 10. In this example the first laser diode is assumed to be formed with nine refractive index altering grooves 21 while the second is assumed to be formed with three refractive index altering grooves 21. The third is assumed to be provided with six refractive index altering grooves 21. Column 1 of Table 2 sets out the fractional positions of the length of the laser diodes of the refractive index altering grooves 21 from the first mirror facet 10 for the first two laser diodes, namely, the nine groove and three groove lasers. The distances of the refractive index altering grooves 21 from the first mirror facet 10 of the nine groove laser diode are set out in Column 2 of Table 2, and as can be seen the nine refractive index altering grooves are assumed to be located at positions identical to those at which the nine refractive index altering grooves 21 were located in the laser diode based on the invention of Table 1, and thus, take account of the effective optical length of the optical path of the laser diode. The positions at which the three refractive index altering grooves 21 are assumed to be located from the first mirror facets 10 are set out in Column 3 of Table 2, and these positions take account of the effective optical length of the optical path.

Column 4 of Table 2 sets out the fractional positions of the length of the laser diode at which the refractive index altering grooves 21 are located from the first mirror facet 10 for the six groove laser diode of this example. Column 5 of Table 2 sets out the actual distances from the first mirror facet 10 at which the six refractive index altering grooves 21 are assumed to be located along the ridge of the third laser diode. The distances of Column 5 are based on the effective optical length of the optical path of the third laser diode. The length $l_i$ of each refractive index altering groove 21 of the nine and three groove laser diodes was assumed to be 1 micron and the length $l_i$ of the six groove laser diode was assumed to be 1.5 microns.

TABLE 2

| | Distance from first mirror facet (microns) | | | Distance from facet (microns) |
|---|---|---|---|---|
| Fractional Position | 9 groove structure | 3 groove structure | Fractional Position | 6 groove structure |
| 1/16 | 18.74 | — | 1/14 | 21.44 |
| 1/8 | 37.55 | 87.52 | 1/7 | 42.94 |
| 3/16 | 56.36 | — | 3/14 | 64.44 |
| 1/4 | 75.16 | 75.10 | 2/7 | 85.95 |
| 5/16 | 93.97 | — | 3/7 | 128.82 |
| 3/8 | 112.78 | — | 5/7 | 214.44 |
| 1/2 | 150.26 | 150.13 | | |
| 5/8 | 187.74 | — | | |
| 3/4 | 225.23 | — | | |

Table 3 sets out the construction of the layer structure which the three laser diodes discussed in this Example 2 were assumed to have. The layers of the structure are set out sequentially from the substrate layer 3 to the top layer 4, the particulars of the substrate layer being 3 set forth in the top of each Column and the particulars of the top layer 4 being set forth at the bottom of each Column. The abbreviation Q.W. represents quantum well layers. The abbreviation bar. represents barrier layers between quantum well layers; λ matched represents consecutive layers are wavelength matched to the degree indicated.

TABLE 3

| Layer | Layer composition | Layer thickness (microns) | Layer Refractive Index |
|---|---|---|---|
| InP | substrate layer 3 | — | 3.1657 |
| $Ga_{1-x}In_xAs_yP_{1-y}$ | $\lambda$ = 1.1 micron | 0.075 | 3.2758 |
| GaInAsP cladding | $\lambda$ = 1.25 microns | 0.03 | 3.3599 |
| GaInAsP × 4 Q.W. | x = 0.69; y = 0.82 | 0.008 | 3.4879 |
| GaInAsP × 3 bar. | $\lambda$ = 1.25 microns | 0.015 | 3.3599 |
| GaInAsP cladding | $\lambda$ = 1.25 microns | 0.03 | 3.3599 |
| GaInAsP | $\lambda$ = 1.1 micron | 0.075 | 3.2758 |
| InP | — | 1.3 | 3.1657 |
| GaInAs | x = 0.53 (top contact) | 0.1 | — |

FIG. 7 illustrates a plot of the threshold gain against wavelength for each of the three laser diodes of this example. The full line represents the plot of the threshold gain against wavelength of the nine groove laser diode, the chain dotted line represents the plot of the threshold gain against wavelength of the six groove laser diode, while the broken line represents the plot of the threshold gain against wavelength for the three groove laser diode. From FIG. 7 it can be seen that the nine groove laser diode gives the lowest threshold and the largest gain difference between modes, (i.e. side mode suppression) of the three laser diodes. The six groove and nine groove laser diodes were chosen to give an emission wavelength of approximately 1552.52 nm.

Referring now to FIGS. 8 and 9, FIG. 8 represents a plot of light output as represented by facet power against operating current for the six groove laser diode of Example 2. FIG. 9 illustrates a plot of side mode suppression ratio against operating current for the six groove laser diode of Example 2. From FIG. 8 it can be clearly seen that one mode in particular gives a considerably higher output than all the other modes. This, thus, indicates the substantially single mode nature of the output of the six groove laser diode of Example 2. From FIG. 9 it can be seen that currents above 20 mAmps yield a side mode suppression ratio of approximately 40 dB. It is therefore clear from the above that changing the pattern of the refractive index altering grooves, and the number of refractive index altering grooves that control of the laser emission wavelength can be effected.

Figure 10:
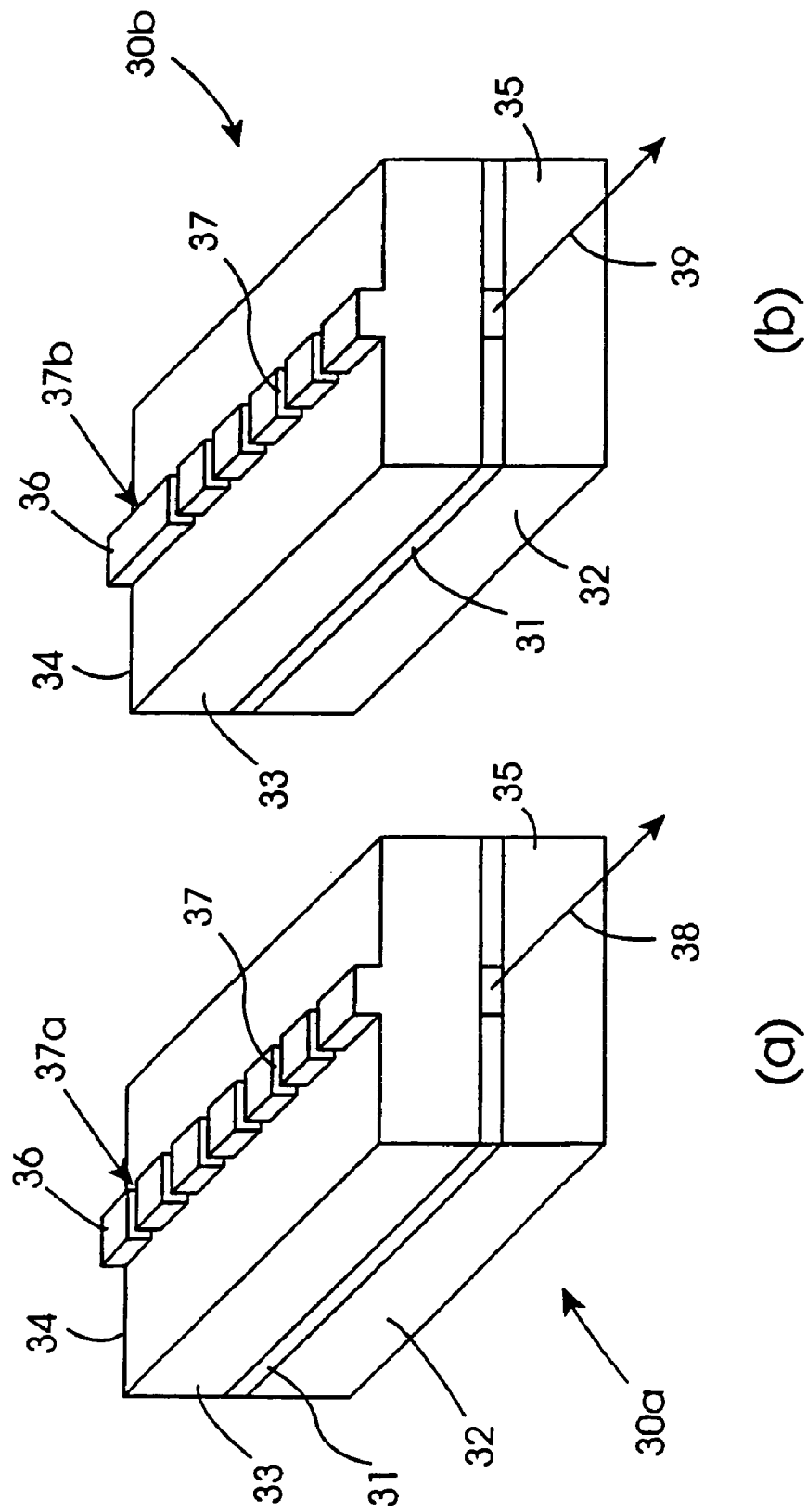

Referring now to FIG. 10 two similar semiconductor laser devices 30(a) and 30(b) each comprising an active layer 31 sandwiched between a bottom layer 32 and a top layer 33. Cleaving the semiconductor wafer into chips defines first and second mirror facets 34 and 35. Each device 30 further comprises a ridge 36 located on the top of the top layers 33. In each case a plurality of refractive index altering grooves 37 are formed in the ridges 36. The distances of the refractive index altering grooves 21 from the first mirror facets 34 along each ridge 36 are defined with respect to the effective optical length of the optical path of each device. The only difference between the two devices 30 shown is in the slot configuration. The first device 30(a) has an additional slot 37(a), while the second device 30(b) has no slot in this position as indicated by the arrow 37(b).

Referring now to FIG. 11 there is illustrated an array 50 of three laser diodes 51a, 51b and 51c which are formed in the same chip. Each laser diode 51 of the array 50 is of substantially similar construction to the laser diode 1 described with reference to FIGS. 1 to 3, and similar components are identified by the same reference numerals. In this embodiment of the invention the ridges 14 of the respective laser diodes 51 are formed by pairs of adjacent parallel channels similar to the channels 12 formed in the top layer 4 of the laser diode 1, however, for ease of illustration the portions of the top layer 4 of the laser array 50 which includes the channels has been omitted. While the laser diodes 51 of the array 50 are formed in the same chip, they act as three separate laser diodes 51, the effective delineation of the respective laser diodes 51 being indicated by the broken lines 52. The laser diode 51a is provided with six refractive index altering grooves 21 which form six corresponding reflecting locations 20. In the laser diode 51b five refractive index altering grooves 21 form five corresponding reflecting locations 20, while in the laser diode 51c four refractive index altering grooves 21 form four corresponding reflecting locations 20. In each of the three laser diodes 51 the positioning of the refractive index altering grooves 21 from the first mirror facet 10 is determined according to the invention and based on the effective optical length of the optical paths 15 of the laser diodes 51. In the laser diode 51b the refractive index altering groove 21 corresponding to the first of the refractive index altering grooves 21 from the first mirror facet 10 of the laser diode 51a has been omitted, while in the laser diode 51c the two refractive index altering grooves corresponding to the first and second refractive index altering grooves 21 from the first mirror facet 10 of the laser diode 51a have been omitted. The distances of the remaining refractive index altering grooves 21 on the ridges 14 of the laser diodes 51b and 51c from the first mirror facet 10 are similar to the spacings between the refractive index altering grooves 21 of the laser diode 51 from the first mirror facet 10. Accordingly, by providing laser diodes 1 in an array similar to the array 50 laser diodes providing respective laser light outputs of different single wavelengths are provided.

Such arrays of laser diodes are particularly advantageous in the field of telecommunications whereby the wavelengths of the laser diodes may be matched to International Telecommunications Union grid requirements (ITU). The ITU guidelines for wavelength division multiplexing (WDM) optical transmission systems recommend the wavelengths and the channel spacing of WDM systems, catering for both repeatered and non-repeatered systems. The current system is based on a grid reference anchored at 193.1 THz, having additional channels spaced 100 GHz above and below this reference frequency. The current standard allows for a total of 41 channels at 100 GHz spacing. This spacing changes to 200 GHz for 4 channel systems or more, and to 400 GHz for 4 channel systems. An advantage of the laser diodes of the present invention for this application is that for an array of laser diodes according to the present invention on a single chip having a nominally similar FP structure, which has been designed for 193.1 THz say, that by optimising the refractive index altering groove configuration of individual lasers within the array the lasing wavelength can be changed to another on the ITU grid which is 100, 200 or 400 GHz away from the grid reference. As a result, adjacent laser diodes on a laser array can have frequencies matching the ITU wavelength grid. This is a particular advantage from the point of view of implementing multi-wavelength sources.

Needless to say other arrangements of refractive index altering grooves in the laser diodes of the array of FIG. 11 may be used, for example, the number of refractive index altering grooves for each laser diode may differ, and indeed, the respective positions of the refractive index altering grooves from the first mirror facet may also differ. The length $l_i$ and/or the depth of refractive index altering grooves may also be altered for varying the difference between the effective refractive index of the partial reflecting locations and the average refractive index of the light conducting medium of the optical path. Indeed the transverse width of the ridge across the top surface thereof may also be varied for varying the effective refractive index of the reflecting locations.

Typically, such laser arrays are provided with ridges of width of 3 microns and of height of approximately 1.3 microns. The inter-ridge distances between ridges of adjacent lasers measured to a longitudinally extending centre line of each ridge is approximately 250 microns. Where the ridges are formed by etching corresponding parallel channels, the channels typically are of approximately 8 microns wide. The metallisation pattern of the lasers of the array is such that the laser diodes of the same array are electrically isolated from each other and can be current driven independently. Otherwise, all other processing steps in the manufacture of such arrays of laser diodes will be well known to those skilled in the art.

EXAMPLE 3

In this example, a laser diode was prepared according to the invention. The laser diode was of general construction similar to that of the laser diode of FIGS. 1 to 3. The laser diode was of length 550 microns, in other words, the actual length of the laser along the optical path between the respective first and second ends of the laser diode was 550 microns. The laser diode was provided with seven identical refractive index altering grooves along its ridge at distances from its first end corresponding to fractions of the optical length of the laser diode as follows, $1/14$, $1/7$, $3/14$, $2/7$, $3/7$, $4/7$ and $5/7$. The refractive index altering grooves of the laser diode was located at the following distances along the ridge of the laser diode from the first end, namely, 39.3, 78.6, 118.0, 157.3, 235.9, 314.5 and 393.1 microns. These locations for the refractive index altering grooves (21) are based on the effective optical length of the optical path, in order to set up the appropriate standing waves and/or harmonics thereof. The laser diode was fabricated using the fabrication procedure referred to in Corbett and McDonald which will be well known to those skilled in the art. The layered structure of the laser diode was as set out in Table 3. The ridge of the laser diode was of width of 2.7 microns, and the refractive index altering grooves were of length $l_i$ of 1.5 microns and of depth of approximately 1 microns.

In order to demonstrate the stability of the lasing mode of the laser diode of this example, the laser diode was subjected to three difference operating currents, namely, operating currents of 1.25 times the threshold current, 1.5 times the threshold current, and 1.75 times the threshold current of the laser diode.

Referring now to FIGS. 12(a) to (c) a plot of the power output against the wavelength obtained from the laser diode operating at the three operating currents is illustrated.

FIG. 12(a) illustrates the plot of power output against wavelength for the laser diode subject to the operating current of 1.25 times the threshold current. FIG. 12(b) illustrates the plot of power output against wavelength for the laser diode subject to the operating current of 1.5 times the threshold current. FIG. 12(c) illustrates the plot of power output against wavelength for the laser diode subject to the operating current of 1.75 times the threshold current.

In each case it can be seen that the power output is a single mode power output, exhibiting good side mode suppressions, typically, in excess of 20 dB and additionally, the wavelength of the light output remains stable over the three operating currents.

While in the embodiments of the invention described the partial reflecting locations of the laser diodes have been described as being formed by refractive index altering grooves, any other means for providing partial reflecting locations could be used. However, in general, it is envisaged that the partial reflecting locations will be formed by altering the effective refractive index of the partial reflecting location. As well as the effective refractive index being altered by refractive index altering grooves, the effective refractive index may be altered in the partial reflecting locations by, for example, doping the partial reflecting locations, or by doping layers adjacent the light conducting layers at locations corresponding to the reflecting locations. Needless to say, any other form of perturbing the light conducting medium in the optical path for altering the effective refractive index of the partial reflecting locations may be used.

While the laser diodes have been described as being ridge type laser diodes, it will of course be appreciated that laser diodes of other type and construction may be prepared according to the invention. For example, the laser diodes and laser waveguides according to the invention could be buried hetrostructure lasers, and needless to say, any other laser diode and laser waveguide construction could be used.

While the invention has been described with reference to laser diodes, it will be readily apparent to those skilled in the art that the benefits of the invention can be derived when the invention is applied to passive waveguides, for example, optical filters and the like. Such optical filters may be formed as semiconductors, but typically, would be formed by a fibre optic core surrounded by a cladding medium of different refractive index to that of the core. Partial reflecting locations in the fibre optic core would be provided by suitable means, such as by forming refractive index altering grooves, which typically, would be formed in the cladding medium surrounding the fibre optics core and would extend around the said medium.

While the waveguides according to the invention, and the method for preparing the waveguides have been described as being laser light waveguides, it will be readily apparent to those skilled in the art that the waveguides may be provided for any other type of light besides laser light.

What is claimed is:

1. An optical waveguide for outputting light of a substantially single predetermined wavelength, the optical waveguide comprising:

a light conducting medium (2) defining a longitudinally extending optical path (15) for guiding the light, the optical path (15) extending longitudinally between respective spaced apart first and second ends (8,9), and a means (20,21) for causing partial longitudinal reflections of the light along the optical path (15) at at least two spaced apart partial reflecting locations (20) along the optical path (15) for deriving light of the predetermined wavelength, wherein the means (20,21) for causing the partial reflections comprises a refractive index altering means (21) for altering the effective refractive index of the light conducting medium (2) presented to light passing along the optical path (15) at each of the at least two reflecting locations (20) for causing the partial reflections, and the means for causing the partial reflections locates the reflecting locations (20) along the optical path (15) at distances from the first end (8) along the optical path (15) which are functions of the product of the actual length of the optical path (15) and the actual refractive index of the light conducting medium (2) defining the optical path, less the sum of the products of the lengths of the reflecting locations (20) and the differences between respective effective refractive indices of the reflecting locations (20) and the actual refractive index of the light conducting medium defining the optical path (15), so that account is taken of alteration to the actual length of the optical path (15) resulting from the effect of the alteration of the effective refractive index at the respective reflecting locations on the actual length of the optical path (15), so that the distances of the reflecting locations along the optical path from the first end are such that the standing waves set up between the first end and each of the reflecting locations, and the standing wave or waves set up between any two of the reflecting locations, and the standing wave set up between the first and second ends, are all in harmonic relationship with each other.

2. An optical waveguide as claimed in claim 1 wherein the length of each reflecting location (20) in the longitudinal direction of the optical path (15) is in the range of 0.3 microns to 200 microns.

3. An optical waveguide as claimed in claim 2 wherein the respective lengths of the reflecting locations (20) along the optical path are the same and the effective refractive indices of the respective reflecting locations (20) are the same.

4. An optical waveguide as claimed in claim 2 wherein the respective lengths of the reflecting locations along the optical path are different, and the effective refractive indices of the respective reflecting locations are different.

5. An optical waveguide as claimed in claim 1 wherein the distance of the $p^{th}$ reflecting location (20) from the first end (8) along the optical path (15) is provided by the formula:

$$L = \frac{X\left\{L_{device}n_{device} - \sum_{i} l_i \Delta n_i\right\} + \sum_{i=1}^{p-1} l_i \Delta n_i + \frac{1}{2} l_p \Delta n_p}{n_{device}}$$

where:

L is the distance of the $p^{th}$ reflecting location from the first end along the optical path, X is the fraction of the actual optical length at which the element is to be placed, $L_{device}$ is the actual length of the optical path, $n_{device}$ is the average refractive index of the light conducting layers of the unperturbed light conducting medium of the optical path presented to the light, $l_i$ is the length of the $i^{th}$ reflecting location in the direction of the optical path, $\Delta n_I$ is the difference between the effective refractive index of the $i^{th}$ partial reflecting location and the average refractive index of the unperturbed optical path, $l_p$ is the length of the $p_{th}$ reflecting location in the direction of the optical path, and $\Delta n_p$ is the difference between the effective refractive index of the $p^{th}$ partial reflecting location and the average refractive index of the optical path.

6. An optical waveguide as claimed in claim 1 wherein the refractive index altering means (21) comprises a plurality of refractive index altering elements (20) one refractive index altering element being provided for each reflecting location, the respective refractive index altering elements being located at distances from the first end along the optical path similar to the distances from the first end of the corresponding reflecting location.

7. An optical waveguide as claimed in claim 6 wherein each refractive index altering element (21) is provided by a refractive index altering groove (21) formed in a medium adjacent the light conducting medium but spaced apart therefrom.

8. An optical waveguide as claimed in claim 7 wherein the depth of the refractive index altering grooves is the same.

9. An optical waveguide as claimed in claim 7 wherein the depth of the refractive index altering grooves is different.

10. An optical waveguide as claimed in claim 6 wherein each refractive index altering element extends substantially transversely relative to the optical path.

11. An optical waveguide as claimed in claim 1 wherein the respective reflecting locations (20) are formed by a dopant.

12. An optical waveguide as claimed in claim 1 wherein the optical waveguide is a waveguide for laser light.

13. An optical waveguide as claimed in claim 12 wherein a ridge (14) is formed on a surface of the semiconductor laser waveguide for defining the optical path through the light conducting medium, and the refractive index altering elements (21) are located in the ridge (14) at locations corresponding to the reflecting location.

14. An optical waveguide as claimed in claim 1 wherein the means (20,21) for causing the partial reflections causes the partial reflections at at least three reflecting locations (20) along the optical path (15).

15. An optical waveguide as claimed in claim 1 wherein the reflecting locations (20) are provided at respective distances from the first end which correspond to the following fractions of the actual length of the optical path, namely, $\frac{1}{16}$, $\frac{1}{8}$, $\frac{3}{16}$, $\frac{1}{4}$, $\frac{5}{16}$, $\frac{3}{8}$, $\frac{1}{2}$, $\frac{5}{8}$ and $\frac{3}{4}$ along the optical path.

16. An optical waveguide as claimed in claim 1 comprising a plurality of optical waveguides provided in the form of an array (50).

17. An array of optical waveguides wherein the respective optical waveguides of the array are optical waveguides as claimed in claim 1.

18. An optical waveguide as claimed in claim 1 wherein the distance from the first end along the optical path to each reflecting location is measured to the centre of the reflecting location.

19. An optical waveguide as claimed in claim 1 wherein the optical waveguide is a passive semiconductor waveguide.

20. An optical waveguide as claimed in claim 1 wherein the reflecting locations are provided at respective distances from the first end which correspond to the following fractions of the actual length of the optical path, namely, $\frac{1}{14}$, $\frac{1}{7}$, $\frac{3}{14}$, $\frac{2}{7}$, $\frac{3}{7}$, $\frac{4}{7}$ and $\frac{5}{7}$ along the optical path.

21. A method for providing an optical waveguide for outputting light of a substantially single predetermined wavelength, the method comprising:

providing a light conducting medium (2) defining a longitudinally extending optical path (15) for guiding the light, the optical path (15) extending longitudinally between respective spaced apart first and second ends (8,9), and providing a means (20,21) for causing partial longitudinal reflections of the light along the optical path (15) at at least two spaced apart partial reflecting locations (20) along the optical path for deriving the light of the predetermined wavelength, wherein the means (20,21) for causing the partial reflections comprises a refractive index altering means (21) for altering the effective refractive index of the light conducting medium (2) presented to light passing along the optical path (15) at each of the at least two reflecting locations (20) for causing the partial reflections, and the means for causing the partial reflections locates the reflecting locations (20) along the optical path at distances from the first end (8) along the optical path (15), so that account is taken of alteration to the actual length of the optical path (15) resulting from the effect of the alteration of the effective refractive index at the respective reflecting locations on the actual length of the optical path (15), so that the distances of the reflecting locations along the optical path from the first end are such that the standing waves set up between the first end and each of the reflecting locations, and the standing wave or waves set up between any two of the reflecting locations, and the standing wave set up between the first and second ends, are all in harmonic relationship with each other, and the distance of the $p^{th}$ reflecting location (20) from the first end (8) along the optical path (15) is provided by the formula:

$$L = \frac{X\left\{L_{device}n_{device} - \sum_i l_i \Delta n_i\right\} + \sum_{i=1}^{p-1} l_i \Delta n_i + \frac{1}{2}l_p \Delta n_p}{n_{device}}$$

where:

L is the distance of the $p^{th}$ reflecting location from the first end along the optical path, X is the fraction of the actual optical length at which the element is to be placed, $L_{device}$ is the actual length of the optical path, $n_{device}$ is the average refractive index of the light conducting layers of the unperturbed light conducting medium of the optical path presented to the light, $l_i$ is the length of the $i^{th}$ reflecting location in the direction of the optical path, $\Delta n_i$ is the difference between the effective refractive index of the $i^{th}$ partial reflecting location and the average refractive index of the optical path, $l_p$ is the length of the $p^{th}$ reflecting location in the direction of the optical path, and $\Delta n_p$ is the difference between the effective refractive index of the $p^{th}$ partial reflecting location and the average refractive index of the unperturbed optical path.

22. A method as claimed in claim 21 wherein the length of each reflecting location (20) in the longitudinal direction of the optical path (15) is in the range of 0.3 microns to 200 microns.

23. A method as claimed in claim 21 wherein the respective lengths of the partial reflecting locations along the optical path are the same and the effective refractive indices of the respective reflecting locations are the same.

24. A method as claimed in claim 21 wherein the respective lengths of the partial reflecting locations along the optical path are different, and the effective refractive indices of the respective reflecting locations are different.

25. An optical waveguide for outputting light of a substantially single predetermined wavelength, the optical waveguide comprising:

a light conducting medium (2) defining a longitudinally extending optical path (15) for guiding the light, the optical path (15) extending longitudinally between respective spaced apart first and second ends (8,9), and a means (20,21) for causing partial longitudinal reflections of the light along the optical path (15) at at least two spaced apart partial reflecting locations (20) along the optical path (15) for deriving light of the predetermined wavelength, wherein the means (20,21) for causing the partial reflections comprises a refractive index altering means (21) for altering the effective refractive index of the light conducting medium (2) presented to light passing along the optical path (15) at each of the at least two reflecting locations (20) for causing the partial reflections, and the means for causing the partial reflections locates the reflecting locations (20) along the optical path (15) at distances from the first end (8) along the optical path (15), so that account is taken of alteration to the actual length of the optical path (15) resulting from the effect of the alteration of the effective refractive index at the respective reflecting locations on the actual length of the optical path (15), so that the distances of the reflecting locations along the optical path from the first end are such that the standing waves set up between the first end and each of the reflecting locations, and the standing wave or waves set up between any two of the reflecting locations, and the standing wave set up between the first and second ends, are all in harmonic relationship with each other, and the distance of the $p^{th}$ reflecting location (20) from the first end (8) along the optical path (15) is provided by the formula:

$$L = \frac{X\left\{L_{device}n_{device} - \sum_i l_i \Delta n_i\right\} + \sum_{i=1}^{p-1} l_i \Delta n_i + \frac{1}{2}l_p \Delta n_p}{n_{device}}$$

where:

L is the distance of the $p^{th}$ reflecting location from the first end along the optical path, X is the fraction of the actual optical length at which the element is to be placed, $L_{device}$ is the actual length of the optical path, $n_{device}$ is the average refractive index of the light conducting layers of the unperturbed light conducting medium of the optical path presented to the light, $l_i$ is the length of the $i^{th}$ reflecting location in the direction of the optical path, $\Delta n_I$ is the difference between the effective refractive index of the $i^{th}$ partial reflecting location and the average refractive index of the unperturbed optical path, $l_p$ is the length of the $p_{th}$ reflecting location in the direction of the optical path, and $\Delta n_p$ is the difference between the effective refractive index of the $p^{th}$ partial reflecting location and the average refractive index of the optical path.

26. An optical waveguide for outputting light of a substantially single predetermined wavelength, the optical waveguide comprising:

a light conducting medium (2) defining a longitudinally extending optical path (I 5) for guiding the light, the optical path (15) extending longitudinally between respective spaced apart first and second ends (8,9), and a means (20,21) for causing partial longitudinal reflections of the light along the optical path (15) at at least three spaced apart partial reflecting locations (20) along the optical path (15) for deriving light of the predetermined wavelength, wherein the means (20,21) for causing the partial reflections locates the reflecting locations (20) along the optical path (15) at distances from the first end (8) along the optical path (15) which correspond to the following fractions of the actual length of the optical path, namely, 1/16, 1/8, 3/16, 1/4, 5/16, 3/8, 1/2, 5/8 and 3/4, so that account is taken of alteration to the actual length of the optical path (15) resulting from the effect of the means (20,21) for causing the partial reflections on the actual length of the optical path (15), and so that the standing waves set up between the first end and each of the reflecting locations, and the standing wave or waves set up between any two of the reflecting locations, and the standing wave set up between the first and second ends, are all in harmonic relationship with each other.

27. An optical waveguide for outputting light of a substantially single predetermined wavelength, the optical waveguide comprising:
   a light conducting medium (2) defining a longitudinally extending optical path (15) for guiding the light, the optical path (15) extending longitudinally between respective spaced apart first and second ends (8,9), and
   a means (20,21) for causing partial longitudinal reflections of the light along the optical path (15) at at least three spaced apart partial reflecting locations (20) along the optical path (15) for deriving light of the predetermined wavelength, wherein the means (20,21) for causing the partial reflections locates the reflecting locations (20) along the optical path (15) at distances from the first end (8) along the optical path (15) which correspond to the following fractions of the actual length of the optical path, namely, 1/14, 1/7, 3/14, 2/7, 3/7, 4/7 and 5/7, so that account is taken of alteration to the actual length of the optical path (15) resulting from the effect of the means (20,21) for causing the partial reflections on the actual length of the optical path (15), and so that the standing waves set up between the first end and each of the reflecting locations, and the standing wave or waves set up between any two of the reflecting locations, and the standing wave set up between the first and second ends, are all in harmonic relationship with each other.

28. A method for providing an optical waveguide for outputting light of a substantially single predetermined wavelength, the method comprising:

providing a light conducting medium (2) defining a longitudinally extending optical path (15) for guiding the light, the optical path (15) extending longitudinally between respective spaced apart first and second ends (8,9), and providing a means (20,21) for causing partial longitudinal reflections of the light along the optical path (15) at at least two spaced apart partial reflecting locations (20) along the optical path for deriving the light of the predetermined wavelength, wherein the means (20,21) for causing the partial reflections comprises a refractive index altering means (21) for altering the effective refractive index of the light conducting medium (2) presented to light passing along the optical path (15) at each of the at least two reflecting locations (20) for causing the partial reflections, and the means for causing the partial reflections locates the reflecting locations (20) along the optical path at distances from the first end (8) along the optical path (15) which are functions of the product of the actual length of the optical path (15) and the actual refractive index of the light conducting medium (2) defining the optical path, less the sum of the products of the lengths of the reflecting locations (20) and the differences between respective effective refractive indices of the reflecting locations (20) and the actual refractive index of the light conducting medium defining the optical path (15), so that account is taken of alteration to the actual length of the optical path (15) resulting from the effect of the alteration of the effective refractive index at the respective reflecting locations on the actual length of the optical path (15), so that the distances of the reflecting locations along the optical path from the first end are such that the standing waves set up between the first end and each of the reflecting locations, and the standing wave or waves set up between any two of the reflecting locations, and the standing wave set up between the first and second ends, are all in harmonic relationship with each other.

* * * * *